US011183602B2

(12) United States Patent
Lu et al.

(10) Patent No.: US 11,183,602 B2
(45) Date of Patent: Nov. 23, 2021

(54) TRENCH CAPACITOR AND METHOD FOR MANUFACTURING THE SAME

(71) Applicant: SHENZHEN WEITONGBO TECHNOLOGY CO., LTD., Shenzhen (CN)

(72) Inventors: Bin Lu, Shenzhen (CN); Jian Shen, Shenzhen (CN)

(73) Assignee: SHENZHEN WEITONGBO TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/664,934

(22) Filed: Oct. 27, 2019

(65) Prior Publication Data

US 2020/0058805 A1 Feb. 20, 2020

Related U.S. Application Data

(63) Continuation of application No. PCT/CN2018/099394, filed on Aug. 8, 2018.

(51) Int. Cl.
*H01L 29/94* (2006.01)
*H01L 21/762* (2006.01)
*H01L 29/66* (2006.01)

(52) U.S. Cl.
CPC ...... *H01L 29/945* (2013.01); *H01L 21/76232* (2013.01); *H01L 29/66181* (2013.01)

(58) Field of Classification Search
CPC .................................................. H01L 29/945
See application file for complete search history.

(56) References Cited

U.S. PATENT DOCUMENTS 5,759,907 A 6/1998 Assaderaghi et al.
5,770,875 A 6/1998 Assaderaghi et al.
(Continued)

FOREIGN PATENT DOCUMENTS

CN 1241809 A 1/2000
CN 1400646 A 3/2003
(Continued)

OTHER PUBLICATIONS

E. J. Ng, C.—. Chiang, Y. Yang, V. A. Hong, C. H. Ahn and T. W. Kenny, "Ultra-high aspect ratio trenches in single crystal silicon with epitaxial gap tuning," 2013 Transducers & Eurosensors XXVII: The 17th International Conference on Solid-State Sensors, Actuators and Microsystems (Transducers & Eurosensors XXVII), Barcelona, 2013, pp. 182-185.
(Continued)

*Primary Examiner* — Xiaoming Liu
(74) *Attorney, Agent, or Firm* — Scully Scott Murphy & Presser

(57) ABSTRACT

An embodiment of the present application relates to a trench capacitor and a method for manufacturing the same. The method for manufacturing the capacitor includes: fabricating a trench reaching a depth of a middle insulating layer on a semiconductor layer of an SOI substrate; and further growing an epitaxial layer of the semiconductor layer on a sidewall of the trench by selective epitaxial growth technology so as to further reduce a width of the trench; filling the trench with an electrically insulating material; and finally, fabricating two electrodes of the capacitor separately through a surface electrode. According to a trench capacitor and a method for manufacturing the same provided in an embodiment of the present application, a process flow is simple, and the capacitor manufactured has two advantages of high capacitance density and high breakdown voltage.

18 Claims, 7 Drawing Sheets

(56) References Cited

U.S. PATENT DOCUMENTS

| | | | | |
|---|---|---|---|---|
| 6,445,055 | B2* | 9/2002 | Iwasakii | H01L 21/76264 257/507 |
| 2013/0141833 | A1* | 6/2013 | Moslehi | H02N 13/00 361/234 |
| 2015/0069573 | A1* | 3/2015 | Huang | H01G 4/228 257/532 |
| 2016/0358802 | A1 | 12/2016 | Moslehi et al. | |

FOREIGN PATENT DOCUMENTS

| | | |
|---|---|---|
| CN | 102244107 A | 11/2011 |
| CN | 105390475 A | 3/2016 |
| EP | 1180800 A2 | 2/2002 |
| WO | 2011082371 A2 | 7/2011 |

OTHER PUBLICATIONS

K Grella: "Zuverlässigkeit von CMOS-Bauelementen auf SOI für den Betrieb bei 250 ° C.", Jan. 1, 2013, retrieved from the Internet: URL: https://duepublico2.uni-due.de/servlets/MCRFileNodeServlet/ duepublico_derivate_00033747/Grella_Diss.pdf [retrieved on May 5, 2020], 184 pages total.

* cited by examiner

TRENCH CAPACITOR AND METHOD FOR MANUFACTURING THE SAME

CROSS REFERENCE TO RELATED APPLICATIONS

The present application is a continuation of international application No. PCT/CN2018/099394, filed on Aug. 8, 2018, which is hereby incorporated by reference in its entirety.

TECHNICAL FIELD

The present application relates to the field of capacitors, and particularly to a trench capacitor and a method for manufacturing the same.

BACKGROUND

A three dimensional (3D) silicon capacitor is a novel capacitor based on semiconductor wafer processing techniques. Compared with a traditional multi-layer ceramic capacitor (MLCC), the 3D silicon capacitor has advantages of small size, high density, high precision, high stability, and long lifetime. In a basic processing flow, a 3D high aspect ratio structure such as a deep hole, a trench, and a column is required to be first processed on a silicon wafer, and then an insulating medium film and a low-resistivity conductive material are deposited on a surface of the 3D structure.

In recent years, with improvement and perfection of etching technology and thin film deposition process, people have gradually mastered a method for fabricating a 3D ultra-high aspect ratio structure on a silicon wafer and depositing a high-quality insulating dielectric film on a surface thereof. Development of technology has made it possible to further increase capacitance density of a 3D silicon capacitor. However, depositing a low-resistivity conductive material with a sufficient thickness in an ultra-high aspect ratio structure is still a technical problem to be solved.

SUMMARY

The present application provides a trench capacitor and a method for manufacturing the same. A process flow thereof is simple, and the capacitor manufactured has two advantages of high capacitance density and high breakdown voltage.

In a first aspect, provided is a trench capacitor, including: a first insulating layer (102), a first semiconductor layer (100), a second insulating layer (110), a first electrode layer (111), and a second electrode layer (112).

Specifically, a first semiconductor layer 100 is disposed on the first insulating layer (102) and provided with a first trench (107) penetrating through the first semiconductor layer 100 and exhibiting a closed ring shape on any cross section of the first semiconductor layer (100), where the first semiconductor layer 100 includes a first portion (101) and a second portion (106), the second portion (106) is a portion of the first semiconductor layer 100 surrounded by the first trench (107), and the first portion (101) is a portion of the first semiconductor layer 100 other than the second portion (106); a second insulating layer (110) is disposed in the first trench (107) and on the first semiconductor layer 100, and connected to the first insulating layer (102) through the first trench (107); a first electrode layer (111) is disposed on the second insulating layer (110), electrically connected to the first portion (101) through a first hole penetrating through the second insulating layer (110), and electrically isolated from the second portion (106); and a second electrode layer (112) is disposed on the second insulating layer (110), electrically isolated from the first portion (101), and electrically connected to the second portion (106) through a second hole penetrating through the second insulating layer (110).

In conjunction with the first aspect, in an implementation manner of the first aspect, the capacitor further includes a passivation insulating layer (104), and the passivation insulating layer (104) is disposed between the first semiconductor layer 100 and the second insulating layer (110), the first hole and the second hole penetrate through the passivation insulating layer (104), and the first trench (107) penetrates through the passivation insulating layer (104).

In conjunction with the first aspect and the above implementation manner, in another implementation manner of the first aspect, an area of the first trench (107) on any cross section of the first semiconductor layer 100 is less than or equal to an area of the first trench (107) on any cross section of the passivation insulating layer (104).

In conjunction with the first aspect and the above implementation manners, in another implementation manner of the first aspect, a material of the passivation insulating layer (104) is at least one of: a silicon oxide, a silicon nitride, and a polymer.

In conjunction with the first aspect and the above implementation manner, in another implementation manner of the first aspect, the capacitor further includes: a second semiconductor layer (103) disposed under the first insulating layer (102) and electrically isolated from the first semiconductor layer 100; and a third electrode layer (113) disposed under the second semiconductor layer (103) and electrically connected to the second semiconductor layer (103).

In conjunction with the first aspect and the above implementation manners, in another implementation manner of the first aspect, the third electrode layer (113) is electrically connected with one of the first electrode layer (111) and the second electrode layer (112).

In conjunction with the first aspect and the above implementation manners, in another implementation manner of the first aspect, the capacitor further includes: a third semiconductor layer (200) disposed under the first insulating layer (102), electrically isolated from the first semiconductor layer 100, and provided with a second trench (207) penetrating through the third semiconductor layer (200) and exhibiting a closed ring shape on any cross section of the third semiconductor layer (200), where the third semiconductor layer (200) includes a third portion (201) and a fourth portion (206), the fourth portion (206) is a portion of the third semiconductor layer 200 surrounded by the second trench (207), and the third portion (201) is a portion of the third semiconductor layer 200 other than the fourth portion (206); a third insulating layer (210) disposed in the second trench (207) and under the third semiconductor layer 200, and connected to the first insulating layer (102) through the second trench (207); a fourth electrode layer (211) disposed under the third insulating layer (210), electrically connected to the third portion (201) through a third hole penetrating through the third insulating layer (210), and electrically isolated from the fourth portion (206); and a fifth electrode layer (212) disposed under the third insulating layer (210), electrically isolated from the third portion (201), and electrically connected to the fourth portion (206) through a fourth hole penetrating through the third insulating layer (210).

In conjunction with the first aspect and the above implementation manners, in another implementation manner of the first aspect, the fourth electrode layer (211) is electrically connected with the first electrode layer (111), and the fifth electrode layer (212) is electrically connected with the second electrode layer (112); or the fourth electrode layer (211) is electrically connected with the second electrode layer (112), and the fifth electrode layer (212) is electrically connected with the first electrode layer (111).

In conjunction with the first aspect and the above implementation manners, in another implementation manner of the first aspect, top and bottom of the capacitor are symmetrical with respect to the first insulating layer (102).

In conjunction with the first aspect and the above implementation manners, in another implementation manner of the first aspect, the first semiconductor layer 100 is of the same material as the third semiconductor layer (201), and/or the second insulating layer (110) is of the same material as the three insulating layers (210), and/or the first electrode layer (111), the second electrode layer (112), the fourth electrode layer (211), and the fifth electrode layer (212) are of the same material.

In conjunction with the first aspect and the above implementation manners, in another implementation manner of the first aspect, the closed ring shape is a circular ring, a rounded rectangular ring or a rounded triangular ring.

In conjunction with the first aspect and the above implementation manners, in another implementation manner of the first aspect, the second insulating layer (110) includes at least one of: a silicon oxide layer, a silicon nitride layer, a metal oxide layer, and a metal nitride layer.

In conjunction with the first aspect and the above implementation manners, in another implementation manner of the first aspect, the first electrode layer (111) and/or the second electrode layer (112) include(s) at least one layer of heavily doped polysilicon, carbon-based material, metal, and titanium nitride.

In a second aspect, provided is a method for manufacturing a trench capacitor, the method including: providing a substrate on insulator (SOI) substrate, the SOI substrate including a first insulating layer and a first semiconductor layer, and the first semiconductor layer being disposed on the first insulating layer; etching the first semiconductor layer to form a first trench penetrating through the first semiconductor layer, and exhibiting a closed ring shape on any cross section of the first semiconductor layer, where the first semiconductor layer includes a first portion and a second portion, the second portion is a portion of the first semiconductor layer surrounded by the first trench, and the first portion is a portion of the first semiconductor layer other than the second portion; depositing an insulating material in the first trench and on the first semiconductor layer to form a second insulating layer; preparing a first hole on the second insulating layer to expose the first portion; depositing a conductive material in the first hole to form a first electrode layer of the capacitor; preparing a second hole on the second insulating layer to expose the second portion; and depositing a conductive material in the second hole to form a second electrode layer of the capacitor.

In conjunction with the second aspect, in one implementation manner of the second aspect, before the etching the first semiconductor layer to form the first trench, the method further includes: growing a passivation insulating layer on an upper surface of the first semiconductor layer; and the etching the first semiconductor layer to form the first trench includes: etching the passivation insulating layer and the first semiconductor layer to form the first trench, the first trench penetrating through the passivation insulating layer and the first semiconductor layer.

In conjunction with the second aspect and the above implementation manner, in another implementation manner of the second aspect, the etching the passivation insulating layer and the first semiconductor layer to form the first trench includes: spin-coating a photoresist layer on a surface of the passivation insulating layer; opening a closed ring-shaped window partially on the photoresist layer; etching the passivation insulating layer and the first semiconductor layer along the closed ring-shaped window to form the first trench; and removing the photoresist layer after the etching.

In conjunction with the second aspect and the above implementation manners, in another implementation manner of the second aspect, before the depositing the insulating material in the first trench and on the first semiconductor layer to form the second insulating layer, the method further includes: epitaxially growing the first semiconductor layer along an inner wall of the first trench; and the depositing the insulating material in the first trench and on the first semiconductor layer to form the second insulating layer includes: depositing an insulating material on an upper surface of the passivation insulating layer and in the first trench after epitaxial growth to form the second insulating layer.

In conjunction with the second aspect and the above implementation manners, in another implementation manner of the second aspect, the growing the passivation insulating layer on the upper surface of the first semiconductor layer includes at least one of: growing a silicon dioxide layer on the upper surface of the first semiconductor layer by thermal oxidation, the passivation insulating layer including the silicon dioxide layer; growing a silicon nitride layer or a silicon oxide layer on the upper surface of the first semiconductor layer by physical vapor deposition (PVD) or chemical vapor deposition (CVD) the passivation insulating layer including the silicon nitride layer or the silicon oxide layer; and spraying or spin-coating a polymer layer or a spin on glass (SOG) layer on the upper surface of the first semiconductor layer, the passivation insulating layer including the polymer layer or the SOG layer.

In conjunction with the second aspect and the above implementation manners, in another implementation manner of the second aspect, the SOI substrate further includes a second semiconductor layer disposed under the first insulating layer, and a third electrode layer disposed under the second semiconductor layer.

In conjunction with the second aspect and the above implementation manners, in another implementation manner of the second aspect, the third electrode layer is electrically connected with one of the first electrode layer and the second electrode layer.

In conjunction with the second aspect and the above implementation manners, in another implementation manner of the second aspect, the SOI substrate further includes a third semiconductor layer disposed under the first insulating layer, and the method further includes: etching the third semiconductor layer to form a second trench penetrating through the third semiconductor layer and exhibiting a closed ring shape on any cross section of the third semiconductor layer, where the third semiconductor layer includes a third portion and a fourth portion, the fourth portion is a portion of the third semiconductor layer surrounded by the second trench, and the third portion is a portion of the third semiconductor layer other than the fourth portion; depositing an insulating material in the second trench and under the third semiconductor layer to form a third insulating layer; opening a third hole on the third insulating layer to expose the third portion; depositing a conductive material in the third hole to form a fourth electrode layer of the capacitor; opening a fourth hole on the third insulating layer to expose the fourth portion; and depositing a conductive material in the fourth hole to form a fifth electrode layer of the capacitor.

In conjunction with the second aspect and the above implementation manners, in another implementation manner of the second aspect, the fourth electrode layer is electrically connected with the first electrode layer, and the fifth electrode layer is electrically connected with the second electrode layer; or the fourth electrode layer is electrically connected with the second electrode layer, and the fifth electrode layer is electrically connected with the first electrode layer.

In conjunction with the second aspect and the above implementation manners, in another implementation manner of the second aspect, the etching is deep reactive ion etching.

In conjunction with the second aspect and the above implementation manners, in another implementation manner of the second aspect, the depositing the insulating material includes: growing silicon dioxide by thermal oxidation, the insulating material including the silicon dioxide; or depositing the insulating material by at least one of PVD, CVD, atomic layer deposition (ALD), spraying, and spin-coating.

In conjunction with the second aspect and the above implementation manners, in another implementation manner of the second aspect, the depositing the conductive material includes: depositing the conductive material by at least one of ALD, PVD, metal organic chemical vapor deposition, evaporation, and electroplating.

Therefore, according to a trench capacitor and a method for manufacturing the same in an embodiment of the present application, a trench structure having a depth reaching a middle insulating layer is fabricated on a surface of an SOI substrate; and an epitaxial layer with heavily doped silicon is grown on a sidewall of the trench by selective epitaxial growth technology so as to further reduce a width of the trench; the trench is filled with an electrically insulating material; and finally two electrodes of a capacitor are fabricated by surface electrode redistribution to obtain a 3D silicon capacitor with small size, high capacity, high breakdown voltage, as well as an advantage of simple process flow.

DETAILED DESCRIPTION

Technical solutions in embodiments of the present application will be described hereinafter with reference to accompanying drawings.

Figure 1:
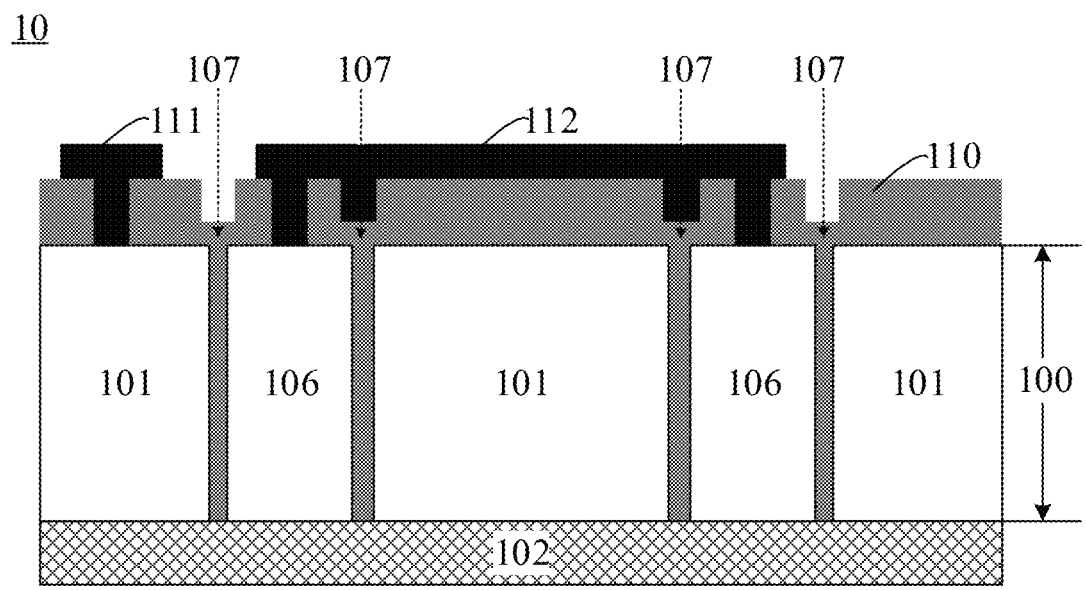
FIG. 1 is a schematic diagram of a trench capacitor according to an embodiment of the present application.

FIG. 1 illustrates a schematic diagram of a trench capacitor according to an embodiment of the present application. As shown in FIG. 1, a capacitor 10 includes a first semiconductor layer 100, a first insulating layer 102, a second insulating layer 110, a first electrode layer 111, and a second electrode layer 112.

Specifically, the first semiconductor layer 100 is disposed on the first insulating layer 102 and provided with a first trench 107, and the first trench 107 vertically penetrates through the first semiconductor layer 100 and exhibits a closed ring shape on any cross section of the first semiconductor layer 100, that is, being substantially enclosed into a column shape on the whole. The first semiconductor layer 100 includes a first portion 101 and a second portion 106, the second portion 106 is a portion of the first semiconductor layer 100 surrounded by the first trench 107. With reference to FIG. 1 for example, the semiconductor layer 100 is provided with two first trenches 107, which are a closed ring-shaped first trench corresponding to two left 107, and another first trench corresponding to two right 107, respectively; a portion surrounded by a first trench corresponding to the two left 107 is a second portion 106; similarly, a portion of the first semiconductor layer 100 surrounded by the right first trenches is another second portion 106; and these two second portions 106 both belong to a second portion. Correspondingly, the first portion 101 is a portion of the first semiconductor layer 100 other than the second portion 106. For example, when the first semiconductor layer 100 includes a plurality of second portions, the first portion 101 is a portion other than all the plurality of second portions 107.

The second insulating layer 110 is disposed in the first trench 107 and on the first semiconductor layer 100, and connected to the first insulating layer 102 through the first trench 107. That is, the second insulating layer 110 covers a surface of the first semiconductor layer 100 and fills up the first trench 107 such that it is connected to the first insulating layer 102, thereby dividing the first semiconductor layer 100 into the first portion 101 and the second portion 106 that are isolated from each other. And the second portion may be plural in number and is spaced apart by the second insulating layer 110.

The first electrode layer 111 is disposed on the second insulating layer 110 (such as covering a surface of the second insulating layer 110), electrically connected to the first portion 101 through a first hole penetrating through the second insulating layer 110, and electrically isolated from the second portion 106 of the first semiconductor layer 100.

The second electrode layer 112 is disposed on the second insulating layer 110 (such as covering the surface of the second insulating layer 110), electrically isolated from the first portion 101, and electrically connected to the second portion 106 through a second hole penetrating through the second insulating layer 110. If there are a plurality of second portions 106, the second electrode layer 112 may be electrically connected to each of the second portions 106 through the second hole.

Figure 2:
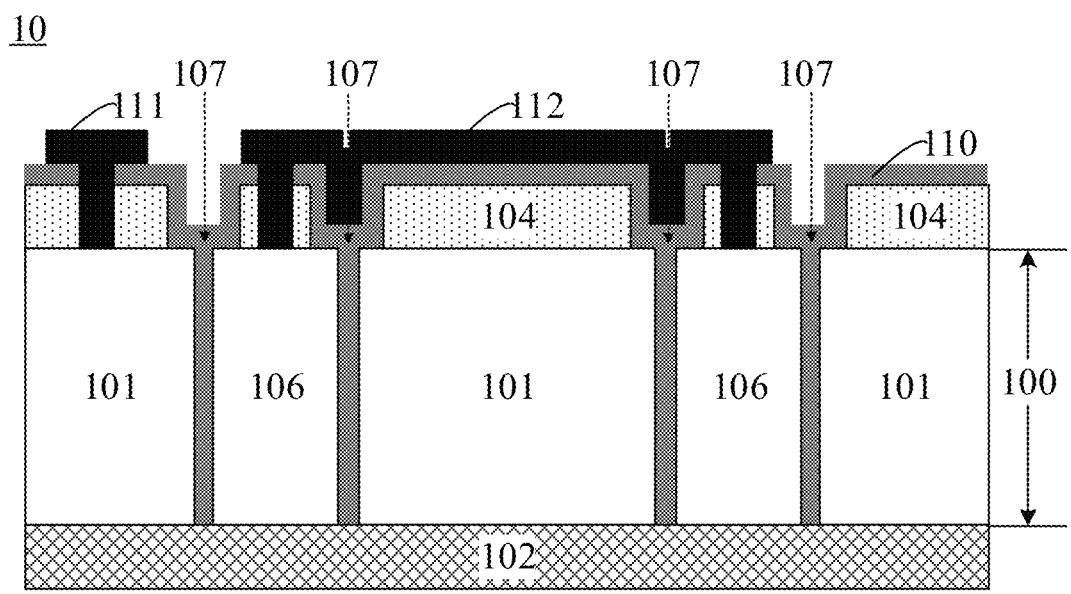
FIG. 2 is a schematic diagram of a trench capacitor according to another embodiment of the present application.

Optionally, as shown in FIG. 2, a capacitor 10 may further include a passivation insulating layer 104, and the passivation insulating layer 104 is disposed between a first semiconductor layer 100 and a second insulating layer 110, and a gap is formed at a region corresponding to a first trench 107 so that the second insulating layer 110 enters and fills the first trench, where an area of the first trench 107 on any cross section of the first semiconductor layer 100 is less than or equal to an area of the first trench 107 on any cross section of the passivation insulating layer 104, that is, a width of the gap of the passivation insulating layer 104 is greater than a width of the first trench in the first semiconductor layer; and a first hole and a second hole penetrate through the passivation insulating layer 104, and the first trench 107 penetrates through the passivation insulating layer 104.

Figure 3:
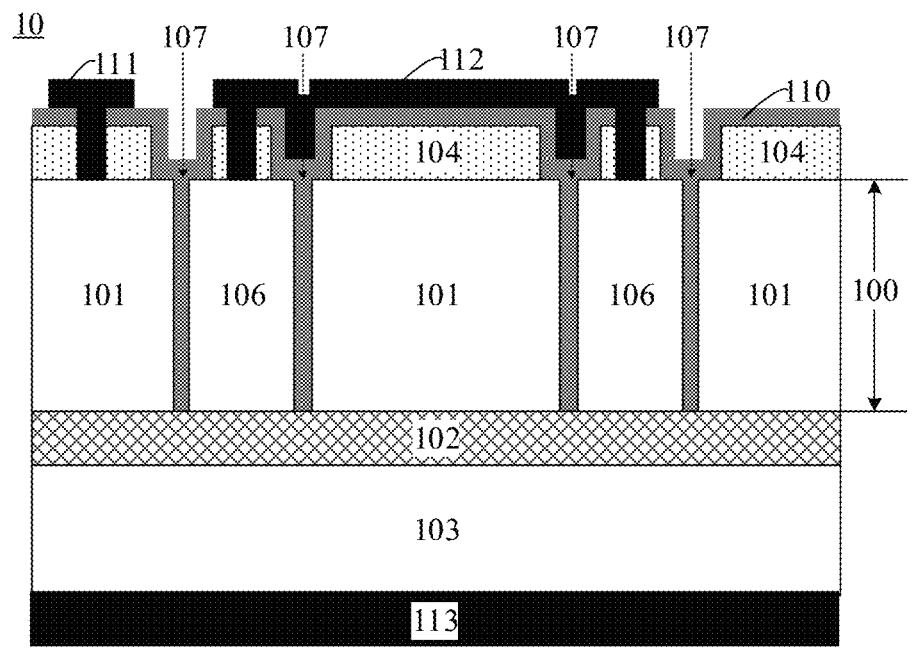
FIG. 3 is a schematic diagram of a simple double-sided capacitor according to an embodiment of the present application.
Figure 4:
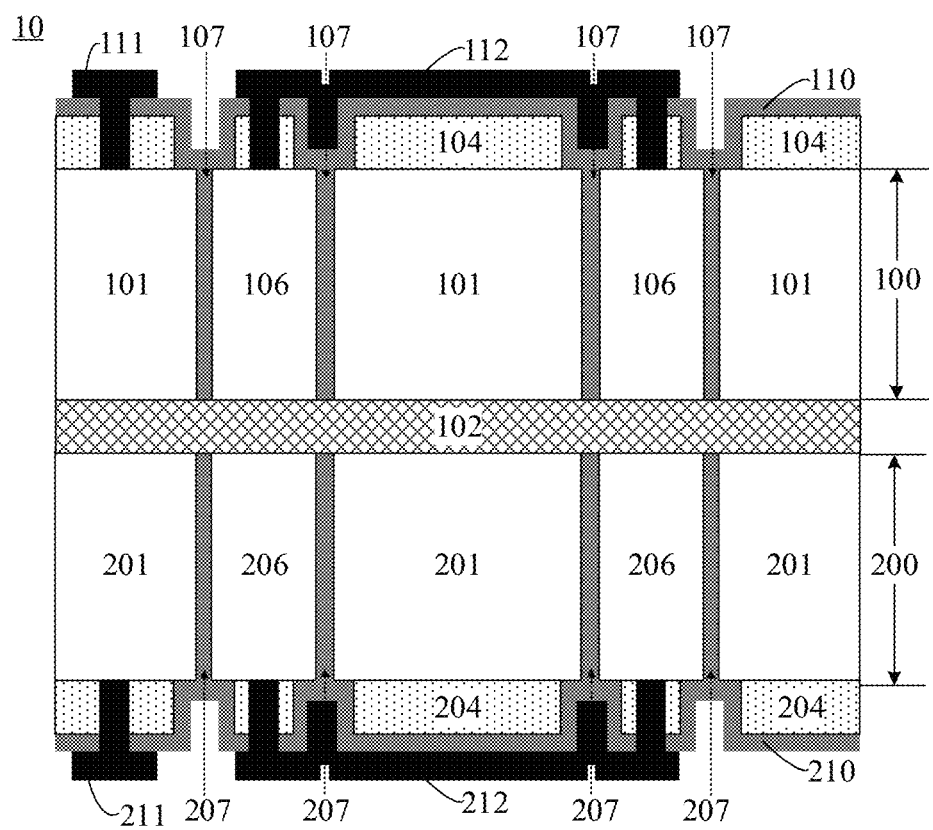
FIG. 4 is a schematic diagram of a double-sided capacitor according to another embodiment of the present application.

Optionally, in order to further increase a capacitance value per unit area, that is, to further increase capacitance density, the capacitor 10 may also be a double-sided capacitor, as shown in FIG. 3 and FIG. 4.

Optionally, as an embodiment, as shown in FIG. 3, a capacitor 10 may further include a second semiconductor layer 103 disposed under a first insulating layer 102 and electrically isolated from a first semiconductor layer 100; and the capacitor 10 includes a third electrode layer 113 disposed under the second semiconductor layer 103 and electrically connected to the second semiconductor layer 103.

It should be understood that when the capacitor 10 as shown in FIG. 3 is packaged, the third electrode layer 113 may be electrically connected with a first electrode layer 111 as one electrode of the capacitor 10, and a second electrode layer 112 is the other electrode of the capacitor; or, the third electrode layer 113 is electrically connected with a second electrode layer 112 as one electrode of the capacitor 10, and a first electrode layer 111 is the other electrode.

Optionally, as an embodiment, as shown in FIG. 4, a capacitor may further include: a third semiconductor layer 200, a third insulating layer 210, a fourth electrode layer 211, and a fifth electrode layer 212. A structure of a portion under a first insulating layer 102 of the capacitor 10 is similar to that of a portion on the first insulating layer 102 of the capacitor.

Specifically, the third semiconductor layer 200 is disposed under a first insulating layer 102, electrically isolated from a first semiconductor layer 100, and provided with a second trench 207, and the second trench 207 penetrates through the third semiconductor layer 200 and exhibits a closed ring shape on any cross section of the third semiconductor layer 200, where the third semiconductor layer 200 includes a third portion 201 and a fourth portion 206, the fourth portion 206 is a portion of the third semiconductor layer 200 surrounded by the second trench 207, and the third portion 201 is a portion of the third semiconductor layer 200 other than the fourth portion 206.

Optionally, similar to the first semiconductor layer 100, the second trench 207 in the third semiconductor layer 200 may be one or plural in number, and correspondingly, the fourth portion 206 surrounded by the second trench 207 may also be plural in number, and details are not described herein again.

The third insulating layer 210 is disposed in the second trench 207 and under the third semiconductor layer 200, and connected to the first insulating layer 102 through the at least one second trench 207. That is, the third insulating layer 210 covers a lower surface of the second semiconductor layer 200 and fills up the second trench 207 such that it is connected to the first insulating layer 102, thereby dividing the third semiconductor layer 200 into the third portion 201 and the fourth portion 206 that are isolated from each other. And the fourth portion 206 may be plural in number and is spaced apart by the third insulating layer 210.

The fourth electrode layer 211 is disposed under the third insulating layer 210 (such as covering a lower surface of the third insulating layer 210), electrically connected to the third portion 201 through a third hole penetrating through the third insulating layer 210, and electrically isolated from the fourth portion 206; and the fifth electrode layer 212 is disposed under the third insulating layer 210 (such as covering the lower surface of the third insulating layer 210), electrically isolated from the third portion 201, and electrically connected to the fourth portion 206 through a fourth hole penetrating through the third insulating layer 210. If there are a plurality of fourth portions 206, the fifth electrode layer 212 may be electrically connected to each of the fourth portions 206 through the fourth hole.

It should be understood that when the double-sided capacitor 10 as shown in FIG. 4 is packaged, the fourth electrode layer 211 may be electrically connected with a first electrode layer 111 as one electrode of the capacitor 10, and the fifth electrode layer 212 is electrically connected with a second electrode layer 112 as the other electrode of the capacitor 10; or, the fourth electrode layer 211 is electrically connected with a second electrode layer 112 as one electrode of the capacitor 10, and the fifth electrode layer 212 is electrically connected with a first electrode layer 111 as the other electrode of the capacitor 10.

It should be understood that top and bottom of the double-sided capacitor as shown in FIG. 4 is symmetrical with respect to the first insulating layer 102. Optionally, the upper and lower portions may also be asymmetric, for example, the closed ring shape of the cross section of the second trench 207 may be different from that of a first trench 107, or a position of the second trench 207 may also be different from that of a first trench 107, or the number of the second trenches 207 may be different from that of first trenches 107. The embodiment of the present application is not limited thereto.

It should be understood that in the embodiment of the present application, the first semiconductor layer 100 may be of the same material as or of a different material from the third semiconductor layer 200. Similarly, the second insulating layer 110 may also be of the same material as or of a different material from the three insulating layer 210; and the first electrode layer 111, the second electrode layer 112, the fourth electrode layer 211, and the fifth electrode layer 212 may also be of the same material or of different materials.

It should be understood that a trench (a first trench, a second trench) in an embodiment of the present application may be a hole with a small difference between length and width of a cross section, or a trench with a large difference between length and width. The size of the trench can be set according to an actual application.

Figure 5:
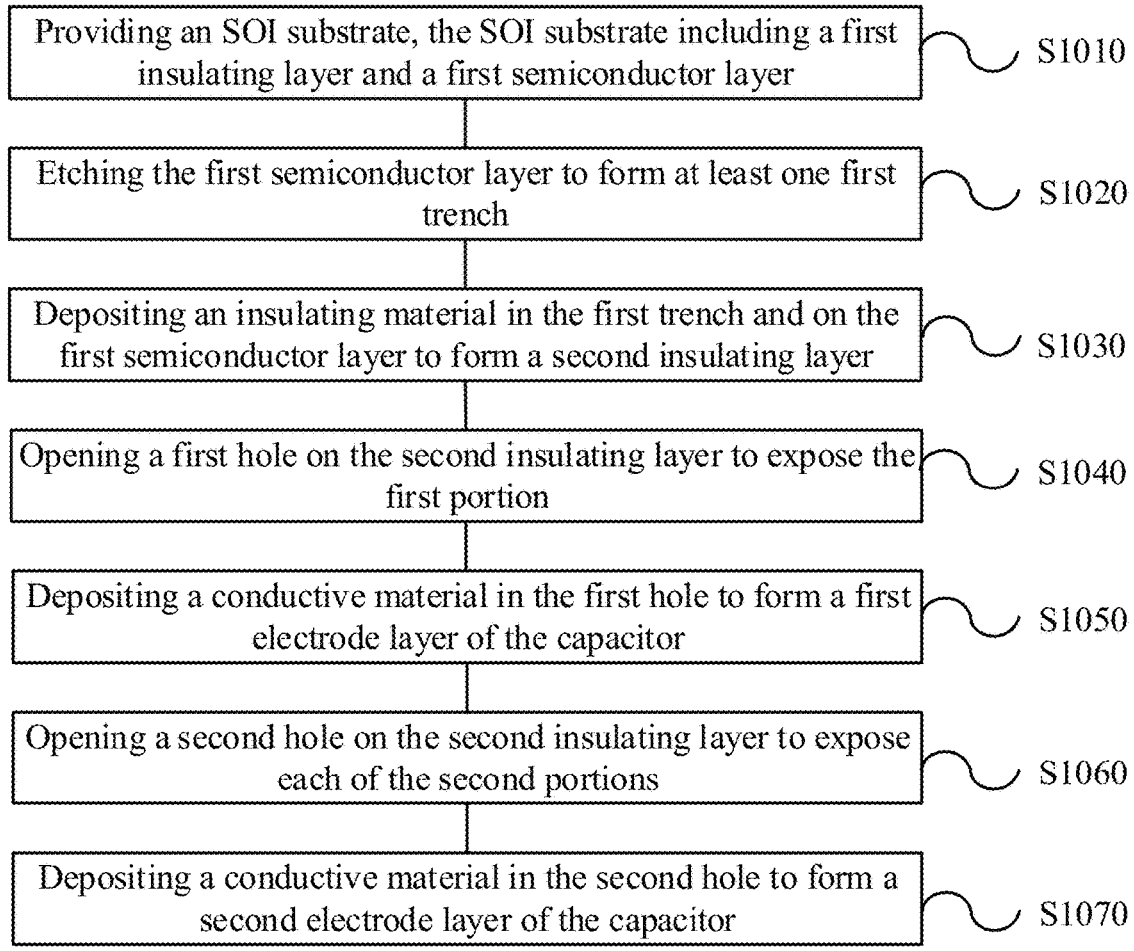
FIG. 5 is a schematic flow chart of a method for manufacturing a trench capacitor according to an embodiment of the present application.

A structure of a capacitor 10 will be described in detail below in conjunction with a method for manufacturing a capacitor 10 as shown in FIG. 5.

FIG. 5 illustrates a schematic flow chart of a method 1000 for manufacturing a trench capacitor according to an embodiment of the present application. As shown in FIG. 5, the method 1000 includes: S1010, an SOI substrate is provided, the SOI substrate includes a first insulating layer and a first semiconductor layer, and the first semiconductor layer is disposed on the first insulating layer; and S1020, the first semiconductor layer is etched to form a first trench.

Figure 6:
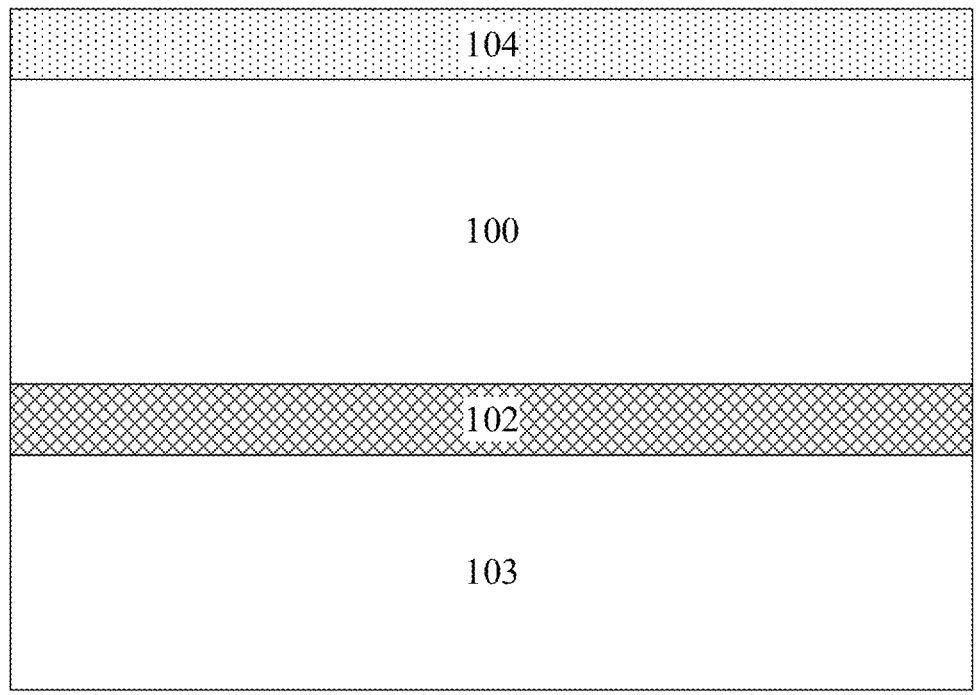
FIG. 6 is a schematic diagram of a process for manufacturing a trench capacitor according to an embodiment of the present application.

It should be understood that, as shown in FIG. 6, an SOI substrate may include a first semiconductor layer 100 and a first insulating layer 102, and the first semiconductor layer 100 is located on the first insulating layer 102. Optionally, the SOI substrate may further include a second semiconductor layer 103.

Specifically, the first semiconductor layer 100 may be single crystal silicon, such as P-type single crystal silicon, and resistivity is about 1 mΩ·cm; the first insulating layer 102 may be silicon dioxide. The second semiconductor layer 103 may also be single crystal silicon, and concentration and doping type of the second semiconductor layer 103 may be selected according to an actual application, and the embodiment of the present application is not limited thereto.

It should be understood that a thickness of each layer of the SOI substrate shown in FIG. 6 is only schematic, and is irrelevant to an actual thickness. For example, the first semiconductor layer 100 may have a thickness of 40 micrometers, and the first insulating layer 102 may have a thickness of 1 micrometer; or a thickness of the first semiconductor layer 100 may also be smaller than that of the first insulating layer 102. The embodiment of the present application is not limited thereto.

In the embodiment of the present application, in conjunction with FIG. 6, before the etching the first semiconductor layer of the SOI substrate in S1020, the method 1000 may further include: growing a passivation insulating layer 104 on an upper surface of the first semiconductor layer 100.

Specifically, the passivation insulating layer 104 may be grown by at least one of the following manners. For example, silicon dioxide is grown on the upper surface of the first semiconductor layer 100 by means of thermal oxidation to form the passivation insulating layer 104. For another example, a silicon nitride or a silicon oxide, such as unpoded silicon glass (USG) or silicon oxide converted from tetra-ethyl orthosilicate (TEOS), is grown by means of PVD or CVD, and used as the passivation insulating layer 104. For another example, various types of polymers by spraying or spin-coating, such as polyimide, parylene, benzocy-clobutene (BCB), or the like, are used as the passivation insulating layer 104. Or the passivation insulating layer 104 may also be a spin on glass (SOG) layer, that is, amorphous phase silicon oxide obtained by spin-coating or spraying a silicide-containing solution on a silicon wafer, then performing heating to remove a solvent, and conducting curing. In view of processing effect and cost, silicon dioxide is generally selected to be grown as the passivation insulating layer 104 by means of thermal oxidation.

Figure 7:
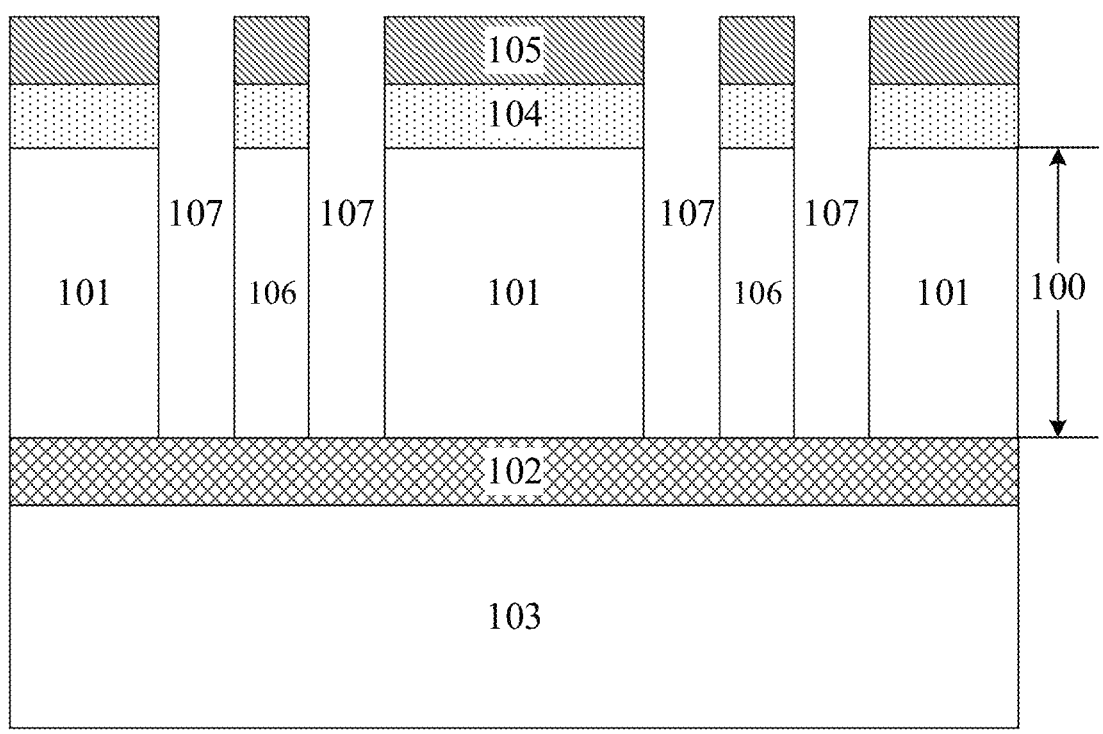
FIG. 7 is another schematic diagram of a process for manufacturing a trench capacitor according to an embodiment of the present application.

In S1020, as shown in FIG. 7, the first semiconductor layer 100 is etched to form a first trench 107; or, if a passivation insulating layer 104 is grown on the first semi-conductor layer 100, the passivation insulating layer 104 and the first semiconductor layer 100 are etched to form the first trench 107.

Figure 8:
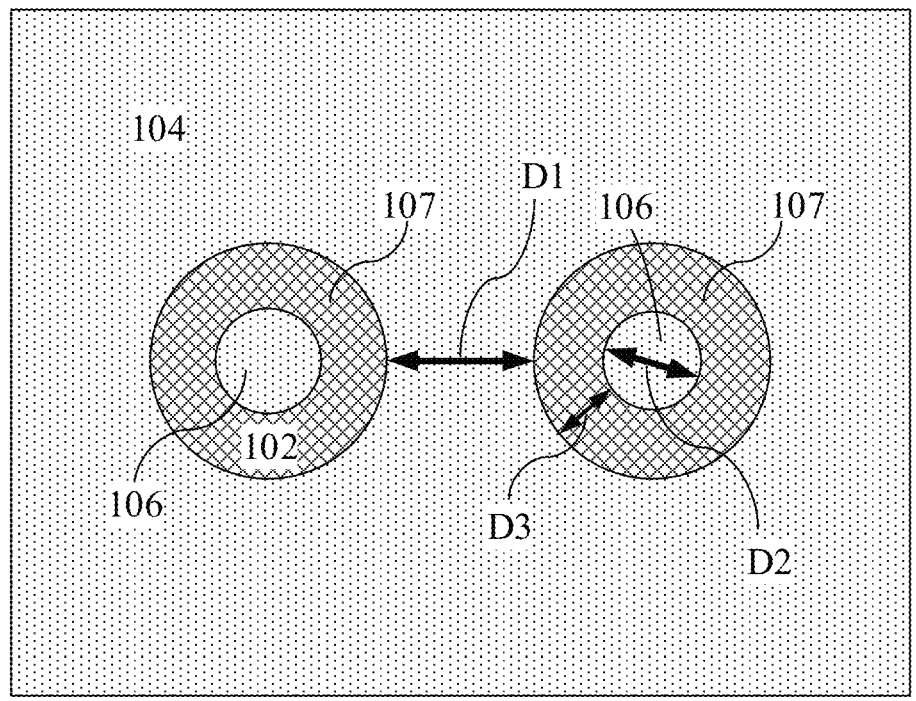
FIG. 8 is a top view of a trench capacitor according to an embodiment of the present application.
Figure 9:
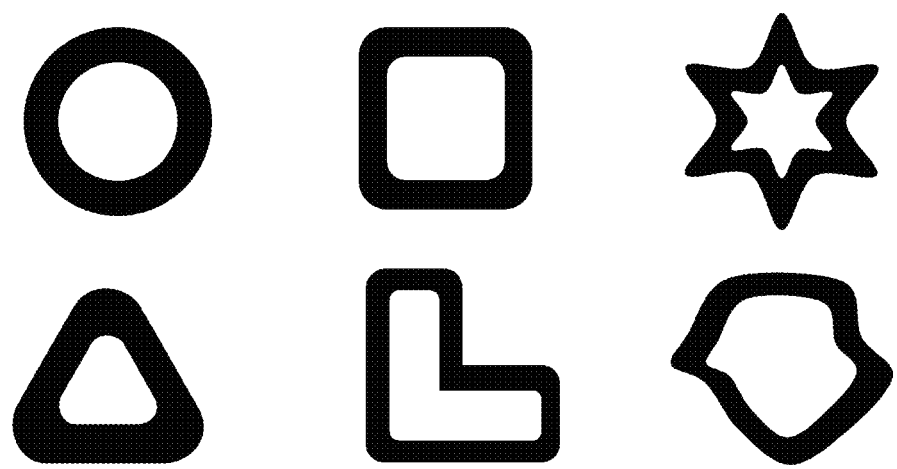
FIG. 9 is a schematic diagram of a trench sectional shape of a trench capacitor according to an embodiment of the present application.

Specifically, the first trench 107 penetrates through the first semiconductor layer 100, and the first trench 107 also penetrates through the passivation insulating layer 104. However, the first trench 107 does not penetrate through the first insulating layer 102. For example, the first trench 107 does not extend to the first insulating layer 102 or partially extends to the first insulating layer 102. The first trench 107 is in a closed ring shape on any cross section of the first semiconductor layer 100. For example, FIG. 8 shows a cross-sectional diagram of a first trench on any cross section of a first semiconductor layer 100 in this embodiment. As shown in FIG. 8, a cross section of the first trench 107 is exemplified as a circular ring. Optionally, the cross section of the first trench 107 may be other closed ring-shaped images. For example, as shown in FIG. 9, a pattern on the cross section of the first trench 107 may be any one of six patterns as shown in FIG. 9, for example, the second rounded rectangular ring in the first row, or the first rounded triangular ring in the second row, or any other closed pattern other than those shown in FIG. 9.

In addition, as shown in FIG. 8, FIG. 8 is a top view, and illustrated by an example that two identical first trenches 107 are etched on the first semiconductor layer 100. Optionally, more than two trenches may also be etched on the first semiconductor layer 100, or only one trench may be etched, and the number of the first trenches 107 may be set according to an area of the cross section of the first semiconductor layer 100. For example, if the cross-sectional area of the first semiconductor layer 100 is larger, a larger number of first trenches may be etched on the first semiconductor layer 100 to increase capacitor capacity; conversely, if the cross-sectional area of the first semiconductor layer 100 is smaller, a smaller number of first trenches may be etched on the first semiconductor layer 100, and even only one first trench may be etched. The embodiment of the present application is not limited thereto.

In addition, FIG. 8 is illustrated by an example that cross-sectional patterns of the two first trenches 107 are the same. Optionally, when multiple first trenches are etched, cross-sectional patterns of multiple first trenches may be completely the same, or may be different from one another. There may also be multiple identical first trenches and multiple different first trenches, and the embodiment of the present application is not limited thereto.

Here, with reference to FIG. 8 for example, a spacing between the two first trenches 107 is D1, a cross section of the first trench 107 is a circular ring, an inner diameter of the circular ring is D2, and a difference between the inner diameter and the outer diameter of the circular ring is D3, where the D1, D2, and D3 can be set according to actual applications. When there are multiple first trenches, the D1 between respective first trenches may be the same or different; the D2 and/or D3 of the respective first trenches may be the same or different; and the embodiment of the present application is not limited thereto.

It should be understood that, as shown in FIG. 7 and FIG. 8, since the cross section of the first trench 107 is in a closed ring shape, the first semiconductor layer 100 may be divided into a first portion 101 and a second portion 106, where the second portion 106 is a portion of the first semiconductor layer 100 surrounded by the first trench 107, that is, each first trench 107 surrounds a second portion 106, or each first trench 107 may encircle a second portion 106 in the first semiconductor layer, and the first portion 101 is a portion of the first semiconductor layer 100 other than the entire second portion 106.

In the embodiment of the present application, the first semiconductor layer 100 and the passivation insulating layer 104 may be etched by means of deep reactive ion etching (DRIE), including types of ultra-low temperature and Bosch, and a higher aspect ratio trench may be formed by means of the DRIE. Specifically, as shown in FIG. 7, a photoresist layer 105 is spin-coated on an upper surface of the passivation insulating layer 104. After exposure and development, at least one closed ring-shaped window may be opened in the photoresist layer 105. The window may be in any shape, for example, any shape as shown in FIG. 9. The passivation insulating layer 104 and the first semiconductor layer 100 are etched along the at least one closed ring-shaped window, where the etching depth reaches the first insulating layer 102 in the middle of the SOI substrate, and thus the at least one first trench 107 can be formed, and the photoresist layer 105 is removed after the etching.

Figure 10:
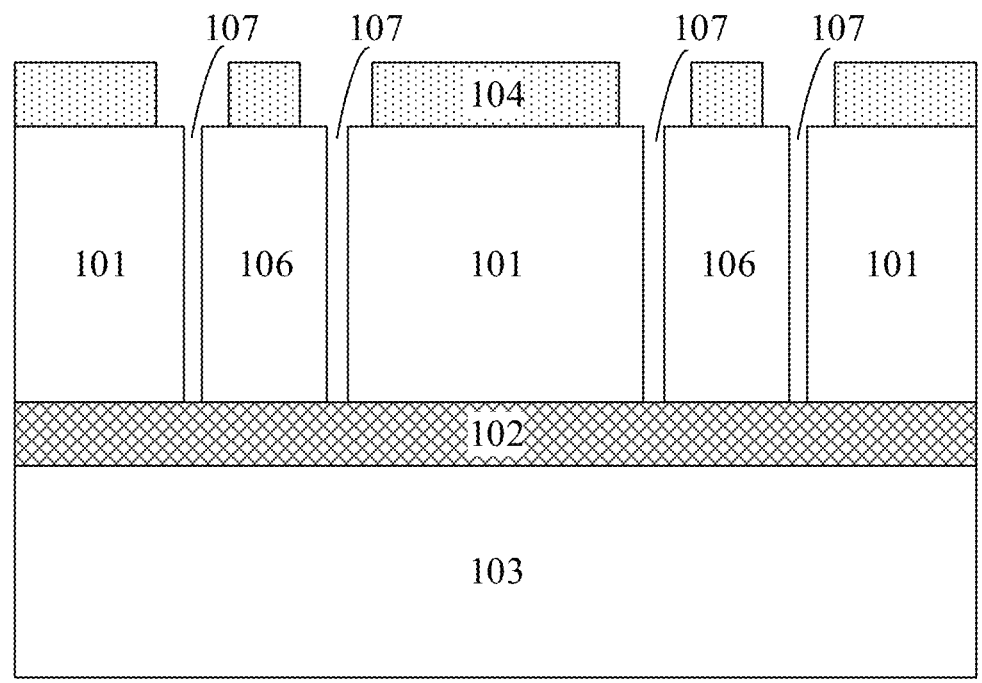
FIG. 10 is yet another schematic diagram of a process for manufacturing a trench capacitor according to an embodiment of the present application.

In the embodiment of the present application, in order to further increase an aspect ratio of the first trench, the method 1000 further includes: epitaxially growing the first semiconductor layer along an inner wall of the first trench, such that the aspect ratio of the trench could be further increased by combining DRIE and selective epitaxial growth techniques, for example, up to about 500:1. Specifically, as shown in FIG. 10, the first semiconductor layer 100 is epitaxially grown along the inner wall of the first trench 107. For example, the SOI substrate may be placed in an epitaxial furnace to grow a P-type heavily doped epitaxial layer. Since top and bottom regions of the second portion 106 are the passivation insulating layer and the first insulating layer 102, and epitaxial growth can only be achieved on a surface of silicon, a main growing region of the epitaxial layer is a sidewall of the first trench 107. Therefore, in this way, the width of the first trench 107 is reduced, that is, a spacing between the first portion 101 and each second portion 106 is reduced, or that is, a spacing of inner walls of the first trench is reduced, thereby forming a high aspect ratio structure. In addition, as shown in FIG. 10, after the epitaxial growth, an area of the first trench 107 on any cross section of the first semiconductor layer 100 is less than an area of the first trench 107 on any cross section of the passivation insulating layer 104.

Figure 11:
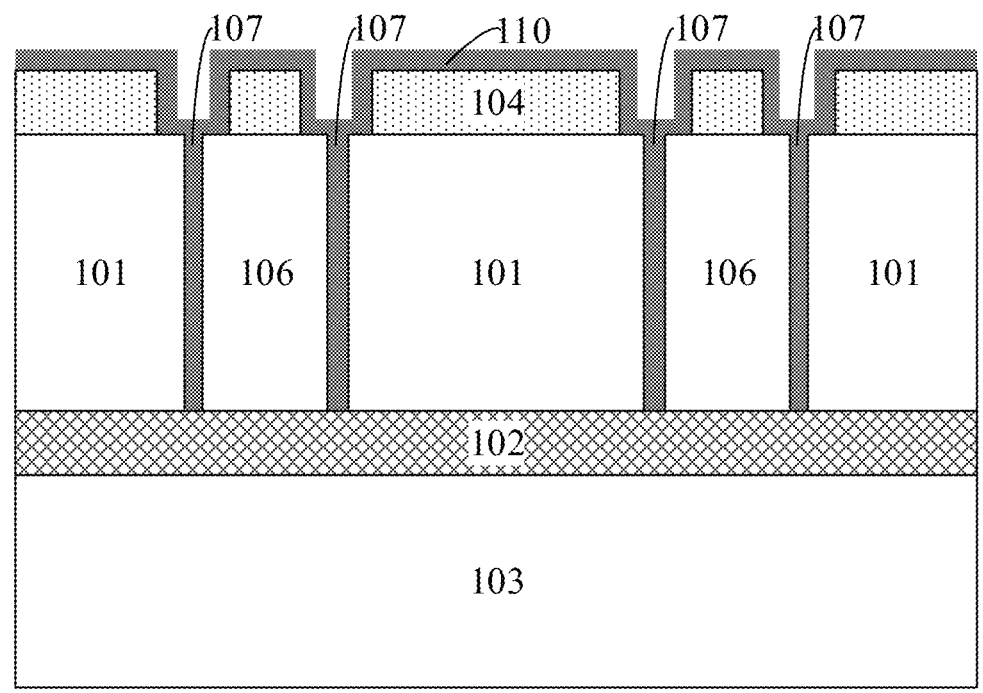
FIG. 11 is yet another schematic diagram of a process for manufacturing a trench capacitor according to an embodiment of the present application.

In S1030, an insulating material is deposited in the first trench and on the first semiconductor layer to form a second insulating layer. Specifically, as shown in FIG. 11, if an upper surface of the first semiconductor layer 100 includes the passivation insulating layer 104, an insulating material is deposited on a surface of the passivation insulating layer 104; and if the first semiconductor layer 100 is epitaxially grown, an insulating material is deposited in the epitaxially grown first trench 107 to form the second insulating layer 110.

It should be understood that there may be various ways of depositing an insulating material in the first trench and on the first semiconductor layer, including the following manners: for example, thermal oxidation by means of which a silicon dioxide layer is grown as a second insulating layer 110, or ALD, PVD, CVD, spin coating, or the like. Correspondingly, a material of the second insulating layer 110 may include a silicon oxide, a silicon nitride, a metal oxide, a metal nitride, or the like, such as silicon dioxide, silicon nitride, aluminum oxide, aluminum nitride, hafnium oxide, zirconium oxide, zinc oxide, titanium dioxide, lead zirconate titanate, or the like. The second insulating layer 110 may be single-layered, or two or multi-layered, and a material of each layer may be the same or different. Specific material and layer thickness may be adjusted according to a capacitance value, a frequency characteristic, a loss and other requirements of a capacitor. The embodiment of the present application is not limited thereto.

The ALD is a mature technology in recent years that a substance is deposited on a surface of an object by layers in the form of a single atomic layer. The ALD has advantages of excellent step coverage, film thickness uniformity, film continuity and material quality. Moreover, the ALD has been able to realize deposition of a high-k insulating dielectric material such as aluminum oxide, hafnium oxide, and zirconium oxide.

Optionally, a material of the passivation insulating layer 104 may be the same as or different from a material of the second insulating layer 110.

It should be understood that when the insulating material is deposited in the first trench 107 and on the first semiconductor layer 100, the formed second insulating layer 110 may be uneven since the first trench 107 exists between the first portion 101 and the second portion 106 in the first semiconductor layer 100. For example, as shown in FIG. 11, the second insulating layer 110 may have a recessed portion on the trench 107, which is not limited in the embodiment of the present application.

In S1040, a first hole is prepared on the second insulating layer to expose the first portion; and in S1050, a conductive material is deposited in the first hole to form a first electrode of the capacitor. Similarly, in S1060, a second hole is prepared on the second insulating layer to expose the second portion; and in S1070, a conductive material is deposited in the second hole to form a second electrode of the capacitor.

Specifically, as shown in FIG. 1 and FIG. 2, at least one first hole is opened in the second insulating layer 110. Here, one hole is taken as an example. If a passivation insulating layer 104 is included under the second insulating layer 110, the first hole penetrates through the second insulating layer 110 and the passivation insulating layer 104 to expose the first portion 101 of the first semiconductor layer. A conductive material is deposited in the first hole, and patterned to form a first electrode layer 111.

Similarly, at least one second hole is opened in the second insulating layer 110, and the number of the second holes is related to the number of the second portions. The number of the second holes is greater than or equal to the number of the second portions, so that each of the second portions is exposed through the second hole. For example, as shown in FIG. 1 and FIG. 2, two second holes are herein exemplified to be opened on two second portions, that is, one hole is correspondingly opened on each of the second portions. Optionally, two or more second holes may also be opened on one or more second portions, and the second portion can also be exposed. If a passivation insulating layer 104 is included under the second insulating layer 110, the second hole passes through the second insulating layer 110 and penetrates through the passivation insulating layer 104 to expose the second portion 106 of the first semiconductor layer. A conductive material is deposited in each of the second holes, and patterned to form a second electrode layer 112.

It should be understood that in the embodiment of the present application, the first hole and the second hole may be fabricated by photolithography.

It should be understood that there are a variety of manners of depositing the conductive material in the first hole and the second hole, for example, the following manners may be selected, such as ALD, PVD, metal organic chemical vapor deposition, evaporation, electroplating, or the like. Correspondingly, the conductive material may be heavily doped polysilicon, various metals such as aluminum, tungsten and copper, a carbon-based material, a low-resistivity compound such as titanium nitride, or a combination of the foregoing several conductive materials, and the embodiment of the present application is not limited thereto.

In the embodiment of the present application, the method 1000 may further include: after thinning and polishing a back surface of the SOI substrate, cutting the corresponding wafer along a scribe line to obtain pieces of capacitor chips for further electrical performance testing, and packaging chips qualified in the performance testing. Optionally, the second semiconductor layer 103 may be thinned to obtain the capacitor 10 as shown in FIG. 1 and FIG. 2.

Figure 12:
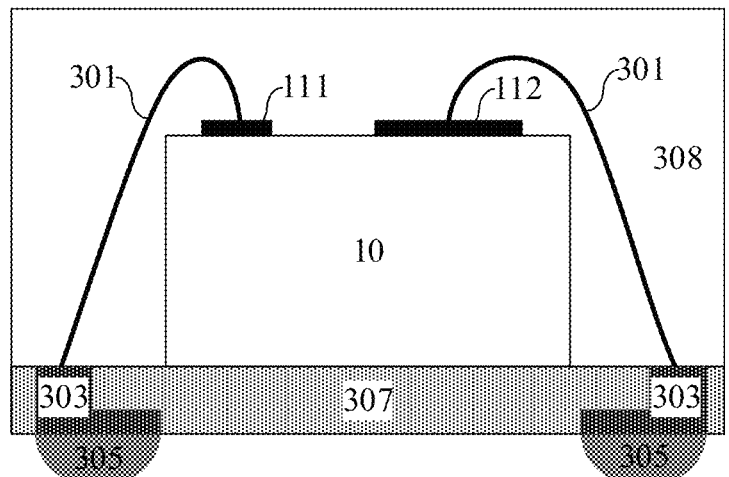
FIG. 12 is a schematic diagram of package of a trench capacitor according to an embodiment of the present application.

Optionally, as an embodiment, FIG. 12 illustrates a packaging method, including: fixing a capacitor 10 with qualified performance on a base plate 307, where the base plate 307 contains prefabricated metal redistribution lines (RDL) 303 and solder balls 305. A first electrode layer 111 and a second electrode layer 112 of the capacitor 10 are respectively connected to the two RDLs 303 on the base plate by two gold wires 301, so that the first electrode layer 111 and the second electrode layer 112 are electrically connected with two solder balls 305, respectively. Finally, the entire structure is plastically packaged with epoxy resin 308. The packaged capacitor is soldered directly onto a printed circuit board (PCB) by surface mount technology (SMT). Optionally, in addition to the above packaging manner, a capacitor chip may also be packaged with other chips in a multi-chip package or encapsulated in other manners. The embodiment of the present application is not limited thereto.

In order to further increase a capacitance value per unit area, the embodiment of the present application further provides a double-sided capacitor, as shown in FIG. 3 and FIG. 4 specifically.

Optionally, as an embodiment, FIG. 3 illustrates a simple double-sided capacitor according to an embodiment of the present application. The simple double-sided capacitor includes a main capacitor and a substrate capacitor, the main capacitor is located on a region of a first semiconductor layer 100 of the upper half of an SOI substrate, and the substrate capacitor is a capacitor formed by the SOI substrate itself. As shown in FIG. 3, the SOI substrate further includes a second semiconductor layer 103 disposed under the first insulating layer 102, and a third electrode layer 113 disposed under the second semiconductor layer 103. Specifically, after main capacitors as shown in FIG. 1 and FIG. 2 are fabricated, the second semiconductor layer 103 at the lower layer of the SOI substrate is thinned and polished, and finally a conductive material is deposited under the second semiconductor layer 103 to fabricate the third electrode layer 113. The second semiconductor layer 103 may be of the same material as the first semiconductor layer; and the third electrode layer 113 may be of the same material as the first electrode layer 111 and the second electrode layer 112.

In order to increase a capacitance value of the substrate capacitor, a thickness of the first insulating layer 102 located in the middle of the SOI substrate is required to be as thin as possible under the premise of leakage current permission, or the first insulating layer 102 is processed into a high-k electrical insulating material or mezzanine containing a high-k material by a special process. The high-k material is an insulating dielectric material having a relative dielectric constant greater than that of silicon dioxide, for example, aluminum oxide, hafnium oxide, or the like.

It should be understood that when the simple double-sided capacitor 10 shown in FIG. 3 is packaged, two capacitors are connected in parallel so as to achieve a purpose of increasing a capacitance value. Optionally, the third electrode layer 113 may be electrically connected with the first electrode layer 111 as one electrode of the capacitor 10, and the second electrode layer 112 is the other electrode; or, the third electrode layer 113 is electrically connected with the second electrode layer 112 as one electrode of the capacitor 10, and the first electrode layer 111 is the other electrode.

Figure 13:
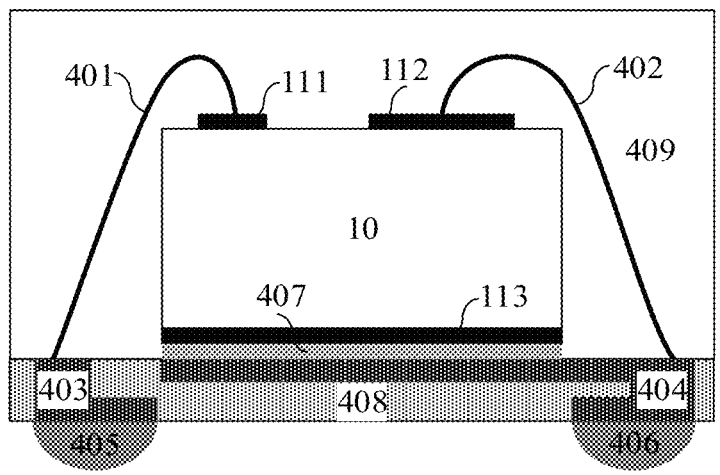
FIG. 13 is a schematic diagram of package of a simple double-sided capacitor according to an embodiment of the present application.

It should be understood that when the simple double-sided capacitor 10 shown in FIG. 3 is packaged, the following method may be employed. Specifically, as shown in FIG. 13, the third electrode layer 113 of the simple double-sided capacitor 10 is fixed on a base plate 408 by a silver paste 407, and is connected to a prefabricated RDL 404 and a solder ball 406 in the base plate; the first electrode layer 111 of the capacitor 10 is connected to an RDL 403 and a solder ball 405 by a gold wire 401; and the second electrode layer 112 of the capacitor 10 is connected to the RDL 404 and the solder ball 406 by a gold wire 402. Finally, the entire structure is plastically packaged with epoxy resin 409. Optionally, in addition to the above packaging manner, a capacitor chip may also be packaged with other chips in a multi-chip package or encapsulated in other manners. The embodiment of the present application is not limited thereto.

Optionally, as an embodiment, FIG. 4 illustrates a double-sided capacitor according to another embodiment of the present application. The double-sided capacitor includes two upper and lower trench capacitors, and the two capacitors are connected in parallel during packaging to achieve a purpose of increasing a capacitance value. Specifically, as shown in FIG. 4, the SOI substrate further includes a third semiconductor layer 200 disposed under the first insulating layer 102, where the third semiconductor layer 200 may be the second semiconductor layer 103 as shown in FIG. 1 and FIG. 2. After the upper trench capacitor 10 is fabricated, the second semiconductor layer 103 is thinned and polished as the third semiconductor layer 200, and the lower trench capacitor is manufactured on the third semiconductor layer 200.

A method for fabricating the lower trench capacitor is similar to a method for fabricating the upper trench capacitor 10. Specifically, similar to the first semiconductor layer 100, the third semiconductor layer 200 is etched to form a second trench 207 similar to the first trench 107, the second trench 207 penetrates through the third semiconductor layer 200 and exhibits a closed ring shape on any cross section of the third semiconductor layer 200. The third semiconductor layer 200 includes a third portion 201 and a fourth portion 206, the fourth portion 206 is a portion of the third semiconductor layer 200 surrounded by the second trench 207, and the third portion 201 is a portion of the third semiconductor layer 200 other than the fourth portion 206. An insulating material is deposited in the second trench 207 and under the third semiconductor layer 200 to form a third insulating layer 210; a third hole is opened on the third insulating layer 210 to expose the third portion 201; a conductive material is deposited in the third hole to form a fourth electrode layer 211 of the capacitor; a fourth hole is opened on the third insulating layer 210 to expose each of the fourth portion 206; and a conductive material is deposited in the fourth hole to form a fifth electrode layer 212 of the capacitor.

Optionally, as shown in FIG. 4, a passivation insulating layer 204 may be further included between the third insulating layer 210 and the third semiconductor layer 200.

It should be understood that the fourth electrode layer 211 may be electrically connected with the first electrode layer 111 as one electrode of the capacitor 10, and the fifth electrode layer 212 is electrically connected with the second electrode layer 112 as the other electrode of the capacitor 10; or, the fourth electrode layer 211 is electrically connected with the second electrode layer 112 as one electrode of the capacitor 10, and the fifth electrode layer 212 is electrically connected with the first electrode layer 111 as the other electrode of the capacitor 10.

Figure 14:
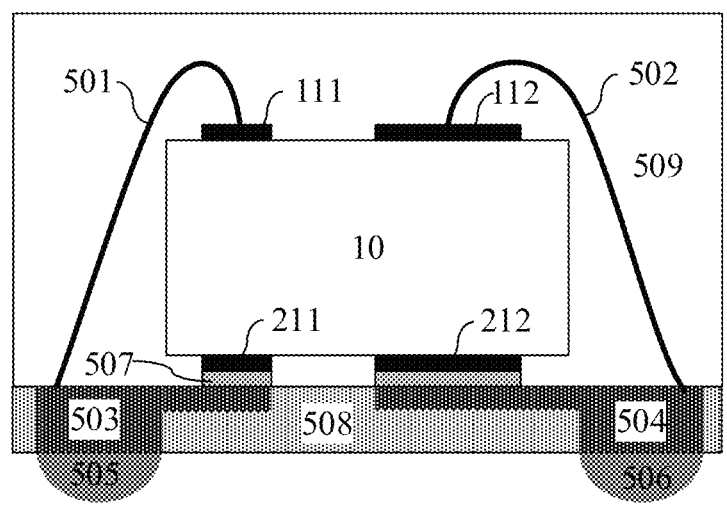
FIG. 14 is a schematic diagram of package of a double-sided capacitor according to another embodiment of the present application.

It should be understood that when the double-sided capacitor 10 shown in FIG. 4 is packaged, the following method may be employed. Specifically, as shown in FIG. 14, the fourth electrode layer 211 and the fifth electrode layer 212 of the double-sided capacitor 10 are fixed on a base plate 508 by a silver paste 507. Hereinafter, description is made by an example that the fourth electrode layer 211 is electrically connected with the first electrode layer 111 as one electrode of the capacitor 10, and the fifth electrode layer 212 is electrically connected with the second electrode layer 112 as the other electrode of the capacitor 10, and therefore the fourth electrode layer 211 is connected to a prefabricated RDL 503 and a solder ball 505 in the base plate, and the fifth electrode layer 212 is connected to a prefabricated RDL 504 and a solder ball 506 in the base plate; the first electrode layer 111 is connected to the RDL 503 and the solder ball 505 by a gold wire 501; and the second electrode layer 112 is connected to the RDL 504 and the solder ball 506 by a gold wire 502. Finally, the entire structure is plastically packaged with epoxy resin 509.

In order to facilitate understanding, a method for manufacturing a trench capacitor according to an embodiment of the present application is described in details in conjunction with a specific example below. Description is made by an example of manufacturing a trench capacitor having two number of circular ring shaped trenches as shown in FIG. 2.

Step 1: An SOI substrate is selected. The SOI substrate has three layers from top down, an upper layer is a first semiconductor layer 100, which is p-type monocrystalline silicon with a thickness of 40 micrometers (with a resistivity of 1 mΩ·cm), a middle layer is a first insulating layer 102, which is silicon dioxide 102 with a thickness of 1 micrometer, and a lower layer is monocrystalline silicon, where a doping type and concentration of the lower layer are not specially required herein. The SOI substrate is placed in a high temperature furnace in which a mixed gas of hydrogen and oxygen is introduced, and oxidized for two hours under a high temperature of 1150° C. Silicon dioxide with a thickness of about 1 micrometer, i.e., a passivation insulating layer 104, is grown on a surface of a wafer, as shown in FIG. 6.

Step 2: A layer of photoresist 105 is spin-coated on a surface of the silicon dioxide, and after exposure and development, two circular ring shaped photoresist windows are opened. Two circular ring shaped trenches, i.e., two first trenches 107, are etched on the upper silicon (i.e., the first semiconductor layer 100) by a DRIE process, as shown in FIG. 7. The depths of the trenches reach the middle silicon dioxide layer. Two 106 are columnar structures surrounded by the first trench 107. Finally, the photoresist 105 is removed to obtain a top view of a structure as shown in FIG. 8. A width D3 of the circular ring shaped trench is 500 nanometers, a diameter D2 of the columnar structure is 2 micrometers, and a spacing D1 of the trench is 2.5 micrometers.

Step 3: The SOI substrate obtained after step 2 is placed in an epitaxial furnace to grow a p-type heavily doped epitaxial layer. As shown in FIG. 10, since the silicon dioxide layers, that is, the passivation insulating layer 104 and the first insulating layer 102, exist in top and bottom regions of the columnar structure 106 surrounded by the first trench 107, and epitaxial growth can only be achieved on a surface of silicon, a main growing region of an epitaxial layer is a sidewall of the first trench 107. In this way, the width of the first trench 107 is reduced to 80 nanometers.

Step 4: After the epitaxial growth, hafnium oxide is deposited in the first trench 107 and on the passivation insulating layer 104 of silicon dioxide by means of ALD as the second insulating layer 110, as shown in FIG. 11.

Step 5: By means of photolithography, three windows are etched in the second insulating layer 110 of hafnium oxide and the passivation insulating layer 104 of silicon dioxide to expose a first portion 101 and two second portions 106 with columnar structures on the upper layer of the SOI substrate, respectively. Then a layer of aluminum with a thickness of two micrometers is deposited on an upper surface of the wafer by means of PVD. Finally, the aluminum is patterned by means of photolithography to form two electrodes 111 and 112 of a capacitor, as shown in FIG. 2. The electrode 111 is connected to the silicon substrate 101, and the electrode 112 is connected to the columnar structure 106.

Step 6: A back surface of the SOI substrate obtained after step 5 is thinned and polished, then the wafer is cut along a scribe line to obtain pieces of capacitor chips 10 for electrical performance testing. As shown in FIG. 12, a chip 10 qualified in the testing is fixed on the base plate 307. The base plate contains the prefabricated RDL 303 and the solder ball 305. The electrodes 111 and 112 of the chip 10 achieve connection with the RDL 303 through the gold wire 301, respectively. Finally, the entire structure is plastically packaged with epoxy resin 308. The packaged capacitor can be soldered directly to a printed circuit board (PCB) by surface mount technology (SMT).

Therefore, according to a trench capacitor and a method for manufacturing the same in an embodiment of the present application, a trench structure having a depth reaching a middle insulating layer is fabricated on a surface of an SOI substrate; and an epitaxial layer with heavily doped silicon is grown on a sidewall of the trench by selective epitaxial growth technology so as to further reduce a width of the trench; the trench is filled with an electrically insulating material; and finally two electrodes of a capacitor are fabricated by surface electrode redistribution to obtain a 3D silicon capacitor with small size, high capacity, high breakdown voltage, as well as an advantage of simple process flow.

It should be understood that, in an embodiment of the present application, "on" may refer to a spatial position between two stacks, or may specifically mean that one stack is formed on a surface of another stack.

It should be understood that in embodiments of the present application, "B corresponding to A" indicates that B is associated with A, and B may be determined based on A. However, it should further be understood that determining B based on A does not mean that B is determined only based on A; and B may also be determined based on A and/or other information.

In addition, the term "and/or" in this specification describes only an association relationship for describing associated objects and represents that three relationships may exist. For example, A and/or B may represent the following three cases: only A exists, both A and B exist, and only B exists. In addition, the character "/" in this specification generally indicates an "or" relationship between the associated contextual objects.

It should be understood that sequence numbers of the foregoing processes do not mean execution sequences in various embodiments of this application. The execution sequences of the processes should be determined according to functions and internal logic of the processes, and should not be construed as any limitation on the implementation processes of the embodiments of this application.

Persons of ordinary skill in the art may realize that preferred embodiments of the present application have been described in detail above with reference to the accompanying drawings, however, the present application is not limited to the specific details in the foregoing embodiments. Persons skilled in the art may make various simple modifications to the technical solution of the present application within the scope of the technical concept of the present application, and these simple modifications all fall within the scope of protection of the present application.

The foregoing descriptions are merely specific embodiments of the present application, but the protection scope of the present application is not limited thereto, persons skilled in the art who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. A trench capacitor, comprising: a first insulating layer; a first semiconductor layer disposed on the first insulating layer and provided with a first trench, the first trench penetrating through the first semiconductor layer and exhibiting a closed ring shape on any horizontal cross section across the surface of the first semiconductor layer, wherein the first semiconductor layer comprises a first portion and a second portion, the second portion is a portion of the first semiconductor layer surrounded by the first trench, and the first portion is a portion of the first semiconductor layer other than the second portion; a second insulating layer disposed in the first trench and on the first semiconductor layer, and connected to the first insulating layer through the first trench; a first electrode layer, as an electrode of the trench capacitor, disposed on the second insulating layer, electrically connected to the first portion through a first hole penetrating through the second insulating layer, and electrically isolated from the second portion; and a second electrode layer, as another electrode of the trench capacitor, disposed on the second insulating layer, electrically isolated from the first portion, and electrically connected to the second portion through a second hole penetrating through the second insulating layer; and a passivation insulating layer disposed between the first semiconductor layer and the second insulating layer, the first hole penetrates through the passivation insulating layer and the second insulating layer to connect with the first portion, the second hole penetrates through the passivation insulating layer and the second insulating layer to connect with the second portion, and the first trench penetrates through the passivation insulating layer and the first semiconductor layer to connect with the first insulating layer; wherein an area of the first trench on any horizontal cross section across the surface of the first semiconductor layer is less than an area of the first trench on any horizontal cross section across the surface of the passivation insulating layer.

2. The capacitor according to claim 1, wherein a material of the passivation insulating layer is at least one of: a silicon oxide, a silicon nitride, and a polymer.

3. The capacitor according to claim 1, wherein the capacitor further comprises:
a second semiconductor layer disposed under the first insulating layer and electrically isolated from the first semiconductor layer; and
a third electrode layer disposed under the second semiconductor layer and electrically connected to the second semiconductor layer.

4. The capacitor according to claim 3, wherein the third electrode layer is electrically connected with one of the first electrode layer and the second electrode layer.

5. The capacitor according to claim 1, wherein the capacitor further comprises:
a third semiconductor layer disposed under the first insulating layer, electrically isolated from the first semiconductor layer, and provided with a second trench, the second trench penetrating through the third semiconductor layer and exhibiting a closed ring shape on any horizontal cross section across the surface of the third semiconductor layer, wherein the third semiconductor layer comprises a third portion and a fourth portion, the fourth portion is a portion of the third semiconductor layer surrounded by the second trench, and the third portion is a portion of the third semiconductor layer other than the fourth portion;
a third insulating layer disposed in the second trench and under the third semiconductor layer, and connected to the first insulating layer through the second trench;
a fourth electrode layer disposed under the third insulating layer, electrically connected to the third portion through a third hole penetrating through the third insulating layer, and electrically isolated from the fourth portion; and
a fifth electrode layer disposed under the third insulating layer, electrically isolated from the third portion, and electrically connected to the fourth portion through a fourth hole penetrating through the third insulating layer.

6. The capacitor according to claim 5, wherein the fourth electrode layer is electrically connected with the first electrode layer, and the fifth electrode layer is electrically connected with the second electrode layer; or
the fourth electrode layer is electrically connected with the second electrode layer, and the fifth electrode layer is electrically connected with the first electrode layer.

7. The capacitor according to claim 6, wherein top and bottom of the capacitor are symmetrical with respect to the first insulating layer.

8. The capacitor according claim 7, wherein the first semiconductor layer is of the same material as the third semiconductor layer, and/or
the second insulating layer is of the same material as the three insulating layers, and/or
the first electrode layer, the second electrode layer, the fourth electrode layer, and the fifth electrode layer are of the same material.

9. The capacitor according to claim 1, wherein the closed ring shape is a circular ring, a rounded rectangular ring or a rounded triangular ring.

10. The capacitor according to claim 1, wherein the second insulating layer comprises at least one of: a silicon oxide layer, a silicon nitride layer, a metal oxide layer, and a metal nitride layer.

11. The capacitor according to claim 1, wherein the first electrode layer and/or the second electrode layer comprise(s) at least one layer of heavily doped polysilicon, carbon-based material, metal, and titanium nitride.

12. A method for manufacturing a trench capacitor, comprising:
providing a substrate on insulator (SOI) substrate, the SOI substrate comprising a first insulating layer and a first semiconductor layer, and the first semiconductor layer being disposed on the first insulating layer;
etching the first semiconductor layer to form a first trench, the first trench penetrating through the first semiconductor layer, and exhibiting a closed ring shape on any horizontal cross section across the surface of the first semiconductor layer, wherein the first semiconductor layer comprises a first portion and a second portion, the second portion is a portion of the first semiconductor layer surrounded by the first trench, and the first portion is a portion of the first semiconductor layer other than the second portion;
depositing an insulating material in the first trench and on the first semiconductor layer to form a second insulating layer;
preparing a first hole on the second insulating layer to expose the first portion;
depositing a conductive material in the first hole to form a first electrode layer as an electrode of the capacitor;
preparing a second hole on the second insulating layer to expose the second portion; and
depositing a conductive material in the second hole to form a second electrode layer as another electrode of the capacitor;
wherein a passivation insulating layer disposed between the first semiconductor layer and the second insulating layer, the first hole penetrates through the passivation insulating layer and the second insulating layer to connect with the first portion, the second hole penetrates through the passivation insulating layer and the second insulating layer to connect with the second portion, and the first trench penetrates through the passivation insulating layer and the first semiconductor layer to connect with the first insulating layer; and
wherein an area of the first trench on any horizontal cross section across the surface of the first semiconductor layer is less than an area of the first trench on any horizontal cross section across the surface of the passivation insulating layer.

13. The method according to claim 12, wherein before the etching the first semiconductor layer to form the first trench, the method further comprises:
growing a passivation insulating layer on an upper surface of the first semiconductor layer; and
the etching the first semiconductor layer to form the first trench comprises:
etching the passivation insulating layer and the first semiconductor layer to form the first trench, the first trench penetrating through the passivation insulating layer and the first semiconductor layer.

14. The method according to claim 13, wherein the etching the passivation insulating layer and the first semiconductor layer to form the first trench comprises:
spin-coating a photoresist layer on a surface of the passivation insulating layer;
opening a closed ring-shaped window partially on the photoresist layer;
etching the passivation insulating layer and the first semiconductor layer along the closed ring-shaped window to form the first trench; and
removing the photoresist layer after the etching.

15. The method according to claim 14, wherein before the depositing the insulating material in the first trench and on the first semiconductor layer to form the second insulating layer, the method further comprises:
epitaxially growing the first semiconductor layer along an inner wall of the first trench; and
the depositing the insulating material in the first trench and on the first semiconductor layer to form the second insulating layer comprises:
depositing an insulating material on an upper surface of the passivation insulating layer and in the first trench after epitaxial growth to form the second insulating layer.

16. The method according to claim 13, wherein the growing the passivation insulating layer on the upper surface of the first semiconductor layer comprises:
growing a silicon dioxide layer on the upper surface of the first semiconductor layer by thermal oxidation, the passivation insulating layer comprising the silicon dioxide layer; or
growing a silicon nitride layer or a silicon oxide layer on the upper surface of the first semiconductor layer by physical vapor deposition or chemical vapor deposition, the passivation insulating layer comprising the silicon nitride layer or the silicon oxide layer; or
spraying or spin-coating a polymer layer or a spin on glass layer on the upper surface of the first semiconductor layer, the passivation insulating layer comprising the polymer layer or the spin on glass layer.

17. The method according to claim 12, wherein the SOI substrate further comprises a second semiconductor layer disposed under the first insulating layer, and a third electrode layer disposed under the second semiconductor layer.

18. The method according to claim 17, wherein the third electrode layer is electrically connected with one of the first electrode layer and the second electrode layer.

* * * * *